(12) United States Patent
Honda

(10) Patent No.: US 7,239,372 B2
(45) Date of Patent: Jul. 3, 2007

(54) EXPOSURE APPARATUS AND DEVICE MANUFACTURING METHOD

(75) Inventor: Tokuyuki Honda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 94 days.

(21) Appl. No.: 11/237,486

(22) Filed: Sep. 27, 2005

(65) Prior Publication Data
US 2006/0072094 A1 Apr. 6, 2006

(30) Foreign Application Priority Data
Sep. 27, 2004 (JP) ............... 2004-278643

(51) Int. Cl.
G03B 27/74 (2006.01)
G03B 27/42 (2006.01)
G03B 27/32 (2006.01)
G02B 26/00 (2006.01)
G02B 5/08 (2006.01)

(52) U.S. Cl. .......................... 355/67; 355/53; 355/77; 359/290; 359/291; 359/855

(58) Field of Classification Search ................ 355/53, 355/67, 75, 77; 359/213, 224, 226, 290, 359/291, 855
See application file for complete search history.

(56) References Cited

U.S. PATENT DOCUMENTS

| 4,801,977 | A | 1/1989 | Ishizaka et al. |
| 5,311,360 | A | 5/1994 | Bloom et al. |
| 5,486,851 | A | 1/1996 | Gehner et al. |
| 5,841,579 | A | 11/1998 | Bloom et al. |
| 6,133,986 | A | 10/2000 | Johnson |
| 6,285,488 | B1 * | 9/2001 | Sandstrom .................. 359/290 |

FOREIGN PATENT DOCUMENTS

JP 6-102459 4/1994

OTHER PUBLICATIONS

Born and Wolf, Principles of Optics; 6th edition (Cambridge University Press, Cambridge, 1999), pp. 306-314.
A. K. Wong, Attenuating Phase Shifting Mask, Resolution Enhancement Techniques in Optical Lithograph (SPIE, Bellingham 2001), pp. 139-151.
D. Malacara, Optical Shop Testing (John Wiley &Sons, 1992), Chapter 3, Common-Path Inteferometers, S. Mallick, pp. 95-122.
D. Malacara, Optical Shop Testing (John Wiley &Sons, 1992), Chapter 4, Lateral Shearing Interferometers, M. Mantravadi, pp. 123-171.

* cited by examiner

Primary Examiner—Alan Mathews
(74) Attorney, Agent, or Firm—Morgan & Finnegan LLP

(57) ABSTRACT

An exposure apparatus includes a beam splitter for splitting light from a light source into first and second beams, a spatial light modulator, arranged in an optical path for the first beam, for modulating a phase distribution of the first beam, a beam coupler for coupling the first beam with the second beam, a projection optical system for projecting a pattern of the spatial light modulator onto a substrate using light from the beam coupler, and a controller for supplying a modulation signal to the spatial light modulator, wherein the spatial light modulator has a one-dimensionally or two-dimensionally arranged pixels, each pixel has plural reflective elements, and the reflective elements in the same pixel displace in the same direction simultaneously.

6 Claims, 10 Drawing Sheets

EXPOSURE APPARATUS AND DEVICE MANUFACTURING METHOD

BACKGROUND OF THE INVENTION

The present invention relates to maskless exposure that forms a pattern on a photosensitive agent applied substrate and manufactures highly integrated devices. The present invention is applicable to manufacturing of a semiconductor device (such as an IC), an imaging device (such as a CCD), a communication device (such as an optical waveguide, and a magnetic head.

A projection exposure apparatus has been conventionally used to expose a mask pattern onto a substrate on which a photosensitive agent is applied, so as to manufacture a semiconductor device, a liquid crystal panel, and the like. However, as finer processing to the mask pattern and larger mask sizes are demanded with the improved integration and increased area of the device, an increase of the mask cost becomes problematic. Accordingly, the maskless exposure that dispenses with the mask for exposure has called attentions.

One exemplary, attractive maskless exposure is a method for projecting a pattern image onto a substrate using a phase-modulation type spatial light modulator ("SLM"). The SLM is a parallel-connected type device, and the number of pixels per unit time may possibly be increased enormously. In particular, a so-called deformable mirror device ("DMD") type SLM that changes a surface shape of a reflector, modulates the light, and is suitable for an exposure apparatus, because the DMD provides a high contrast, works at a relatively short wavelength, and is stable to the environment. The phase modulation manner needs a minute displacement of a mirror, such as about a quarter of the wavelength of the light, and works at a high speed. Prior art of the phase-modulation type SLM include U.S. Pat. Nos. 5,841,579, 5,486,851, 5,311,360 and 6,133,986, Japanese Patent Application, Publication No. 6-102459.

Disadvantageously, the conventional maskless exposure that utilizes the phase-modulation type SLM has difficulties in providing a high throughput and a high resolution with a simple structure. For example, use of a diffraction grating type modulation pattern called a grating light valve ("GLV") makes complex the SLM's structure. See U.S. Pat. Nos. 5,841,579 and 5,311,360.

A large Schlieren optics is needed to convert a light phase pattern into a light intensity pattern and project the light intensity pattern onto the substrate (U.S. Pat. Nos. 5,486,851 and 6,133,986), but use of the Schlieren optics makes complex the optical system. In addition, a fine lens array is needed in addition to the Schlieren optics (U.S. Pat. No. 6,133,986), and it is difficult to manufacture and mount the fine lens array having excellent imaging performance with small aberrations and dispersions.

BRIEF SUMMARY OF THE INVENTION

Accordingly, it is an exemplary object of the present invention to provide an exposure apparatus that provides a high resolving power and a high throughput with a relatively simple structure, and a device manufacturing method using the same.

An exposure apparatus according to one aspect of the present invention includes a beam splitter for splitting light from a light source into first and second beams, a spatial light modulator, arranged in an optical path for the first beam, for modulating a phase distribution of the first beam, a beam coupler for coupling the first beam with the second beam, a projection optical system for projecting a pattern of the spatial light modulator onto a substrate using light from the beam coupler, and a controller for supplying a modulation signal to the spatial light modulator, wherein the spatial light modulator has a one-dimensionally or two-dimensionally arranged pixels, each pixel has plural reflective elements, and the reflective elements in the same pixel displace in the same direction simultaneously.

A device manufacturing method includes the steps of exposing an object using an exposure apparatus, and developing the object that has been exposed. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

DETAILED DESCRIPTION OF THE PREFERRED EMBODIMENTS

Figure 1:
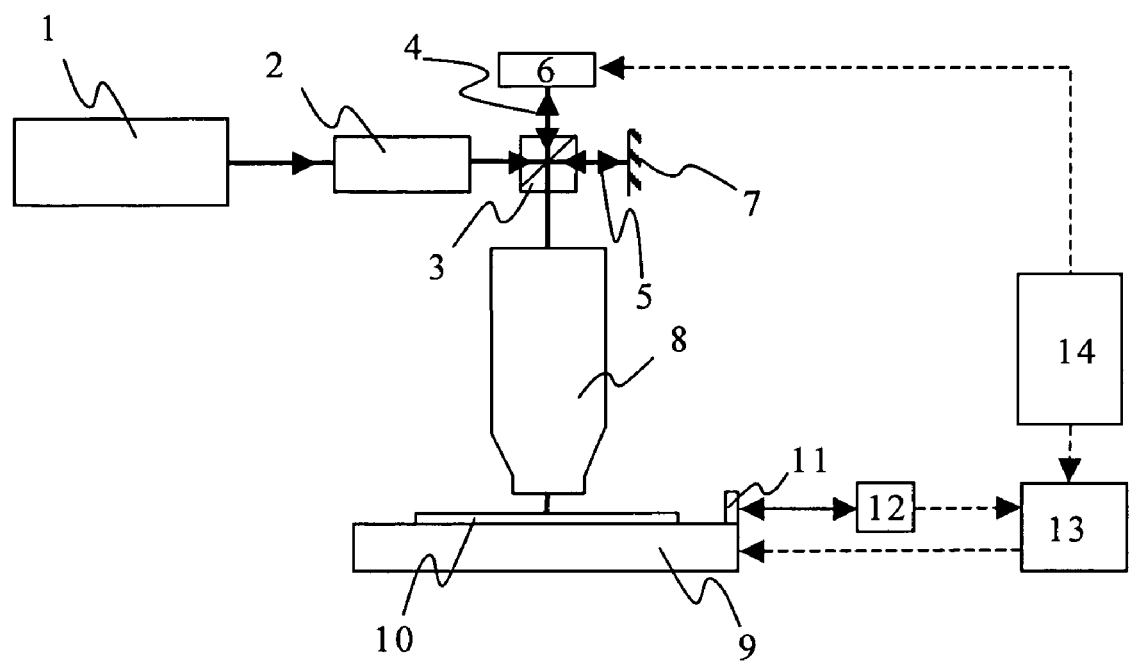
FIG. 1 is a schematic block diagram of a maskless exposure apparatus according to a first embodiment of the present invention.

FIG. 1 is a schematic block diagram of principal part of a maskless projection exposure apparatus according to a first embodiment of the present invention. The maskless projection exposure apparatus uses a Michelson's interferometer, which makes a beam splitter and a beam coupler of the same optical element.

In FIG. 1, 1 denotes a light source, such as a mercury lamp, an excimer laser, a solid laser and a semiconductor laser. An illumination optical system 2 adjusts a beam shape, a polarization state, and a light intensity of the light emitted from the light source 1. The illumination optical system 2 is designed to incorporate known optical elements, such as a lens, a mirror and a polarization element, in accordance with the characteristic of the light source.

The light from the illumination optical system 2 is incident upon a beam splitter/coupler 3, which divides the light into signal (or first) light 4 and reference (or second) light 5. The beam splitter/coupler 3 may, for example, be a cubic prism or a plate half-mirror. The signal light 4 is incident upon a SLM 6. The SLM 6 modulates a spatial phase distribution of the signal light 4, and may be, for example, made of a liquid crystal panel or a DMD that changes a surface shape of a reflector and modulates the light. The DMD is suitable for an exposure apparatus, because the DMD provides a high contrast, works at a relatively short wavelength, and is stable to the environment. The signal light 4 returns to the beam splitter/coupler 3 after passing the SLM 6. The reference light 5 returns to the beam splitter/coupler 3 after reflected by a reference mirror 7. The beam splitter/coupler 3 couples the signal light 4 with the reference light 5 again, and supplies the resultant light to a projection optical system 8.

The projection optical system 8 may be configured as a known catoptric, dioptric or catadioptric optical system. A stage 9 is provided at an exit side of the projection optical system 8, and holds a substrate on an imaging surface of the SLM 6. The liquid may be filled in a space between the projection optical system 8 and the substrate 10 for immersion exposure, which advantageously increases the depth of focus ("DOF") and improves the resolving power. The stage 9 has a mirror 11 used to measure a position in combination with a distance-measuring laser interferometer 12.

The distance-measuring laser interferometer 12 is electronically coupled with a stage controller 13, and controls a position of the stage 9. The stage controller 13 and the SLM 6 are electronically coupled with the electronic controller 14. The electronic controller 14 moves a stage via the stage controller 13 while sending a modulation signal to the SLM 6, thereby forming a desired pattern on the substrate 10 through scanning exposure.

This embodiment allows the signal light and the reference light to interfere with each other, and provide pattern's bright and dark parts in accordance with a phase difference between the signal and reference lights. Thus, this embodiment realizes a projection exposure apparatus with a phase-modulation type SLM and no Schlieren optics. In addition, this embodiment can use a SLM having a simple structure, since it is not necessary to use a diffraction grating type modulation pattern as in the GLV.

While this embodiment discusses the Michelson's interferometer, the present invention is applicable to various types of interference optical systems in addition to the Michelson interferometer by varying optical paths' shapes for the signal light and the reference light. For example, the present invention may be implemented by using a Mach-Zehnder Interferometer, which uses separate optical elements for the beam splitter and the beam coupler. Instead of returning the reference light and the signal light that has passed the SLM to the beam splitter, both lights can enter the beam coupler for superposition.

Assume that the SLM 6 is a DMD that is made of an array of one-dimensional or two-dimensional fine reflective elements. The scattering light is likely to occur due to gaps among the reflective elements, and has a discrete spatial frequency component corresponding to a period of the reflective elements.

In order to separate the scattering light from the light corresponding to a desired pattern, each pixel corresponding to a minimum pattern size may have plural reflective elements, wherein the reflective elements in one pixel may be driven in the same direction so that each reflective element has the same phase. This configuration can block the diffraction component of the scattering light by putting out the component to the outside of the numerical aperture ("NA") of the projection optical system, and pass only the light corresponding to the desired pattern.

The number of reflective elements per one pixel may be two or more in terms of the removal of the scattering light, and there is no upper limit. However, an excessively large number of reflective elements per one pixel increase the DMD's manufacturing cost. It is thus preferable that the number of reflective elements per one pixel is maintained between two and six.

This embodiment can express the light intensity distribution of the pattern on the substrate as follows:

$$I(x,y)=I_s(x,y)+I_r(x,y)+2\sqrt{I_s(x,y)I_r(x,y)}\cos\phi(x,y)$$ [EQUATION 1]

where $I_s(x,y)$ is a light intensity distribution of the signal light on the substrate, $I_r(x,y)$ is a light intensity distribution of the reference light on the substrate, $\phi(x,y)$ is a phase difference distribution between the signal light and the reference light, x and y denote a coordinate of the position. In Equation 1, the interference effect is expressed by the final term in the right side, i.e., $2\sqrt{I_s(x,y)I_r(x,y)}\cos\phi(x,y)$. It is understood from Equation 1 that changing $\phi(x,y)$ with the SLM would control the light intensity distribution $I(x,y)$ on the substrate. In addition, from Equation 1, the contrast of the pattern projected onto the substrate can be expressed as $2\sqrt{I_s(x,y)I_r(x,y)}/(I_s(x,y)+I_r(x,y))$. Hence, when the signal light and the reference light have the same light intensity, the contrast becomes the highest.

A higher contrast is advantageous to the process stability in the usual lithography. In this respect, a ratio that is made close to 1 is preferred between the light intensity of the signal light and that of the reference light. The resolution can be improved by changing the ratio, when an extremely fine pattern is exposed.

This embodiment may apply one exemplary principle described in A. K. Wong, Attenuating Phase Shifting Mask, Resolution Enhancement Techniques in Optical Lithography (SPIE, Bellingham 2001), pp.139–151. The attenuating phase shift mask ("PSM") is set to a phase difference of about 180° between the bright part and the dark part, and the light intensity of the dark part in the pattern of, for example, about 7% of that of the bright part. For this purpose, the ratio between the light intensity of the signal light and that of the reference light is made, for example, about 30% (or its reciprocal), and the phase difference between the reference light and the signal light is made about 180°. Another embodiment may apply the resolution enhancement technology ("RET") principal that utilizes a chrome-less mask, and form a pattern by making the light intensity of the reference light zero with a phase distribution of 180° to the signal light. It is thus preferable for the RET to adjust the light intensity ratio between the signal light and the reference light, and block the reference light. A description will be given of such embodiments.

Figure 2:
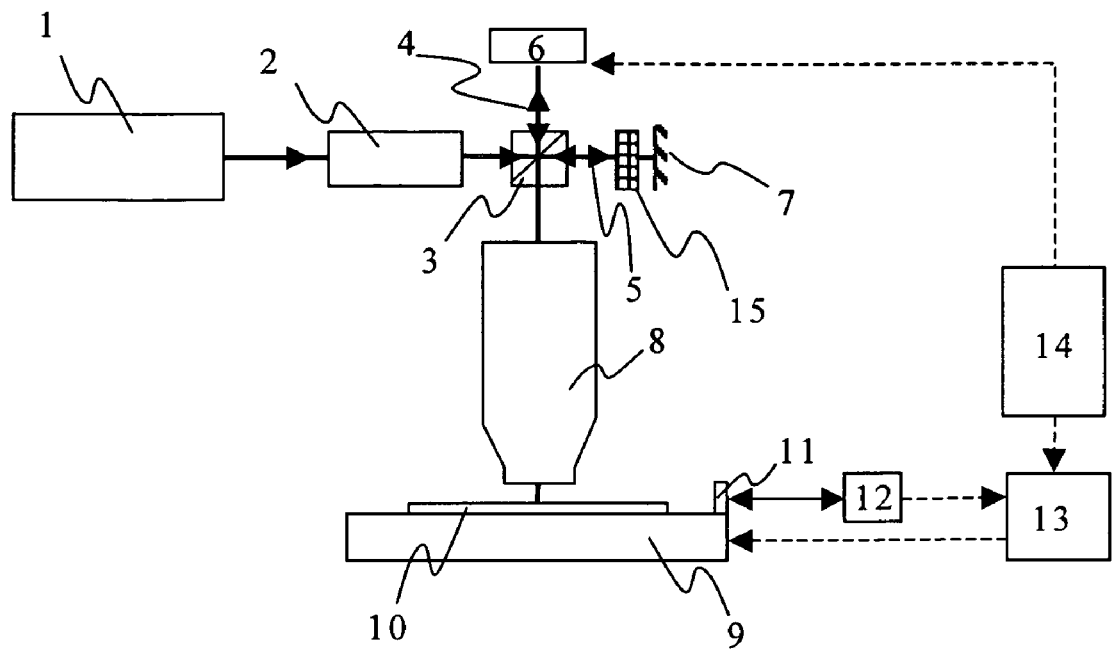
FIG. 2 is a schematic block diagram of a maskless exposure apparatus according to a second embodiment of the present invention.

FIG. 2 is a schematic block diagram of a maskless exposure apparatus according to a second embodiment of the present invention. Different from the first embodiment, this embodiment provides an attenuation filter on an optical path of the signal light or the reference light, and enables the light intensity ratio between the signal light and the reference light to be adjusted. Other than that, the structure is the same.

Figure 3:
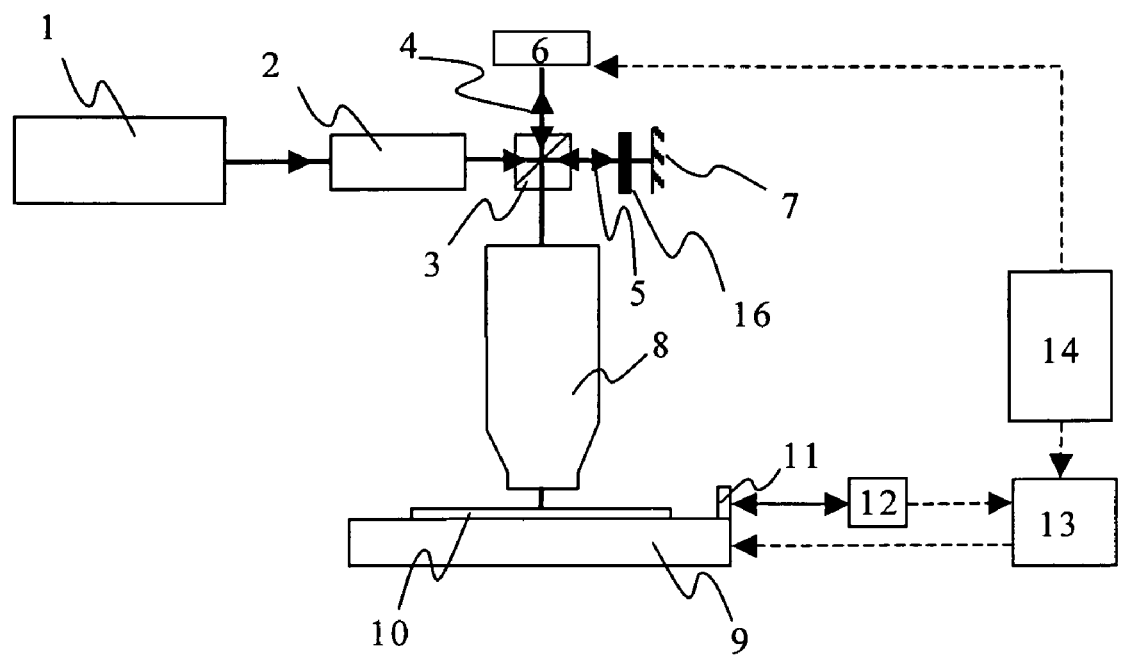
FIG. 3 is a schematic block diagram of a maskless exposure apparatus according to a third embodiment of the present invention.

FIG. 3 is a schematic block diagram of a maskless exposure apparatus according to a third embodiment of the present invention. Different from the first embodiment, this embodiment provides a shutter 16 on an optical path of the reference light, and blocks the reference light if necessity arises. Other than that, the structure is the same.

Figure 4:
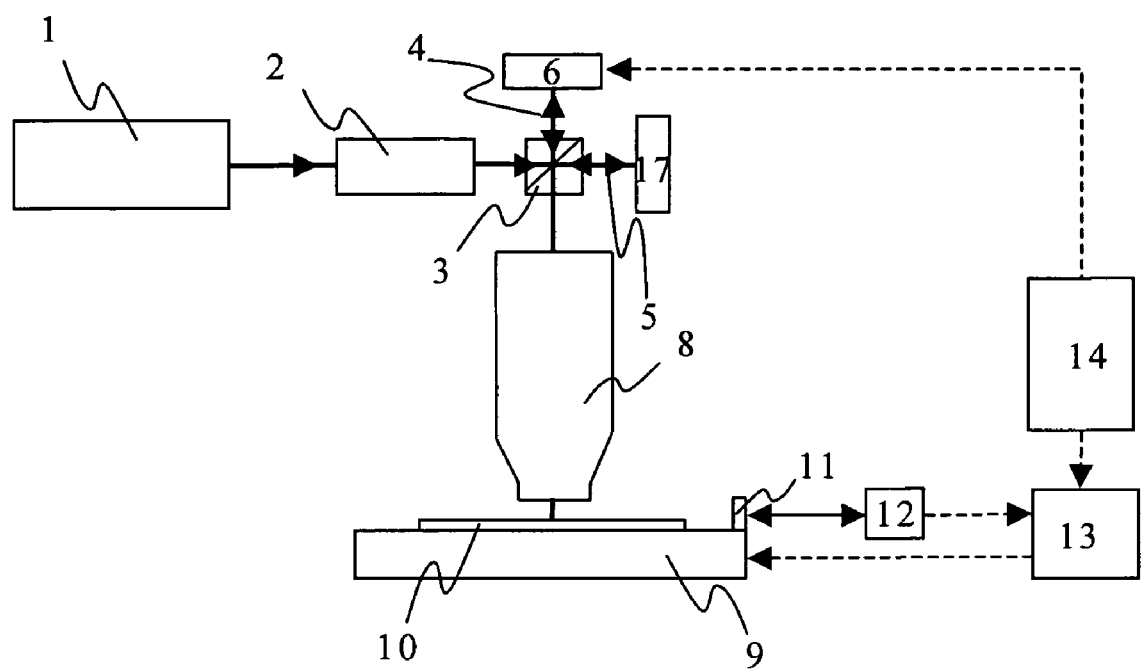
FIG. 4 is a schematic block diagram of a maskless exposure apparatus according to a fourth embodiment of the present invention.

FIG. 4 is a schematic block diagram of a maskless exposure apparatus according to a fourth embodiment of the present invention. Different from the first embodiment, this embodiment provides another SLM 17 on an optical path of the reference light, and controls the phase difference and the light intensity ratio between the signal light and the reference light spatially at an arbitrary time. Other than that, the structure is the same.

Figure 5:
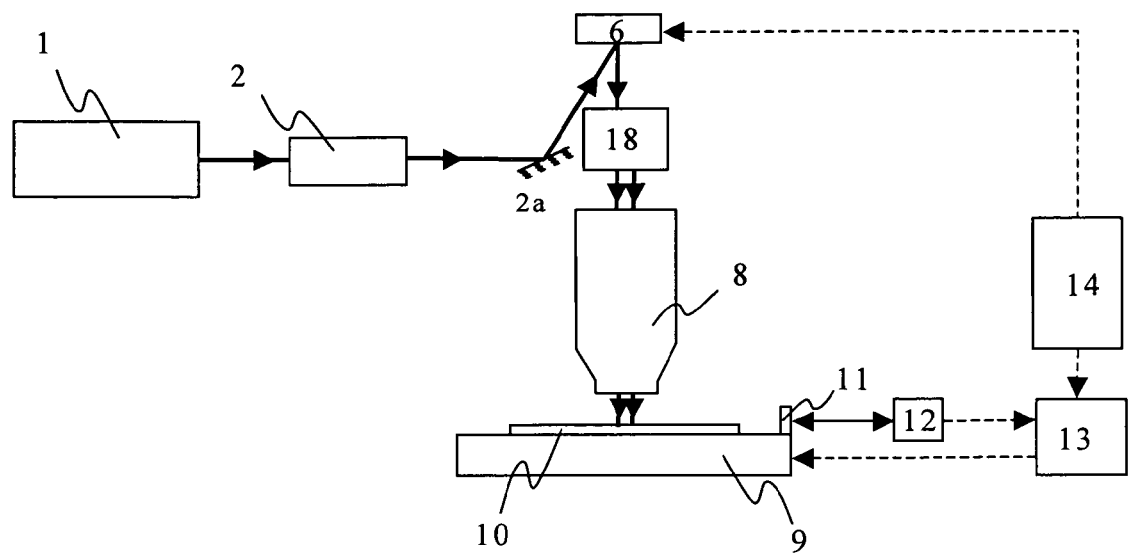
FIG. 5 is a schematic block diagram of a maskless exposure apparatus according to a fifth embodiment of the present invention.

FIG. 5 is a schematic block diagram of a maskless exposure apparatus according to a fifth embodiment of the present invention. This embodiment uses a shearing optical system for the present invention. Referring now to FIG. 5, a description will be given of a difference between this embodiment and the first embodiment.

The light beam from the illumination optical system 2 is incident, via a deflection mirror 2a, upon the SLM 6, which modulates a spatial phase distribution of the light beam. The light beam from the SLM 6 is incident upon the shearing optical system 18, which divides the light beam into two beams with a lateral offset between them. More specifically, relative to one beam, the other beam is offset in a direction perpendicular to the beam traveling direction. The two beams given the lateral offset are incident upon the projection optical system 8. These two beams form two images of the SLM 6 on the substrate 10 arranged on the imaging surface of the projection optical system 8, and the interference between two images provides a desired light intensity distribution pattern.

Figure 6:
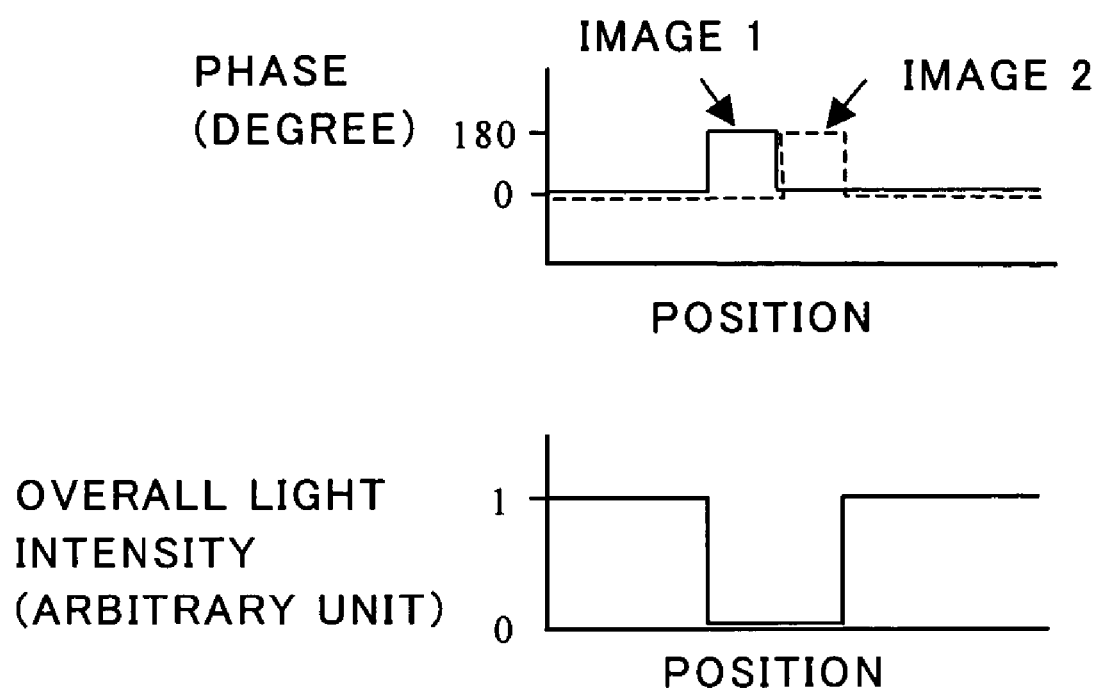
FIG. 6 is an explanatory view showing a relationship between a phase distribution given by a SLM shown in FIG. 5 and a resultant illustrative interference pattern.

FIG. 6 shows a phase distribution given by the SLM and an illustrative interference pattern given by it. For simplicity purposes, suppose the spatial light generator in which pixels are arranged one-dimensionally with a lateral offset amount corresponding to one pixel by the shearing optical system. When one pixel is provided with a phase difference of 180° from another pixel, the interference cancels out at part corresponding to two pixels and the dark part is formed in the interference image between the two images 1 and 2 that are given the lateral offset. Thus, a combination between the phase modulation and the shearing interference easily provides a light intensity pattern.

The shearing optical system is easily designed with reference to a wide variety of optical systems in the known shearing interferometer. The optical system used in the shearing interferometer is roughly classified into one that uses a semi-reflecting surface for beam splitting and the other that uses a birefringence material for beam splitting. See D. Malacara, Optical Shop Testing, John Wiley & Sons, 1992, chapters 3 and 4.

Figure 7:
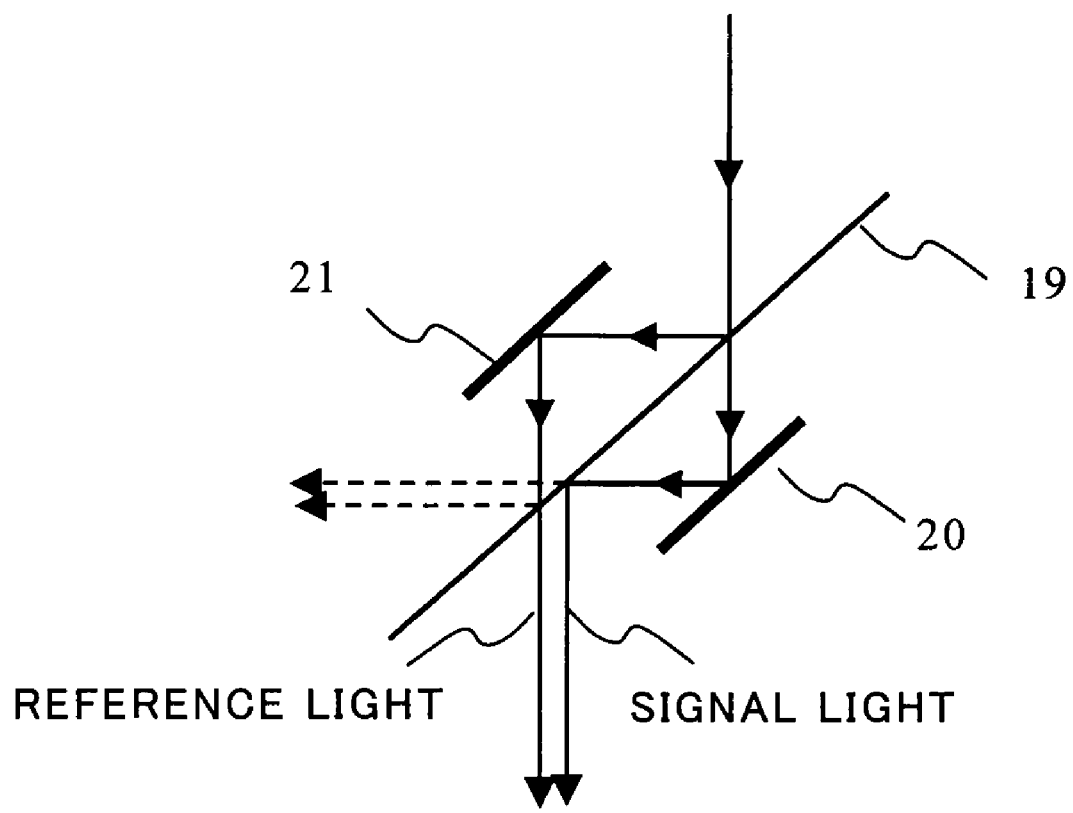
FIG. 7 is a schematic block diagram showing an exemplary shearing optical system in the maskless exposure apparatus shown in FIG. 5.
Figure 8:
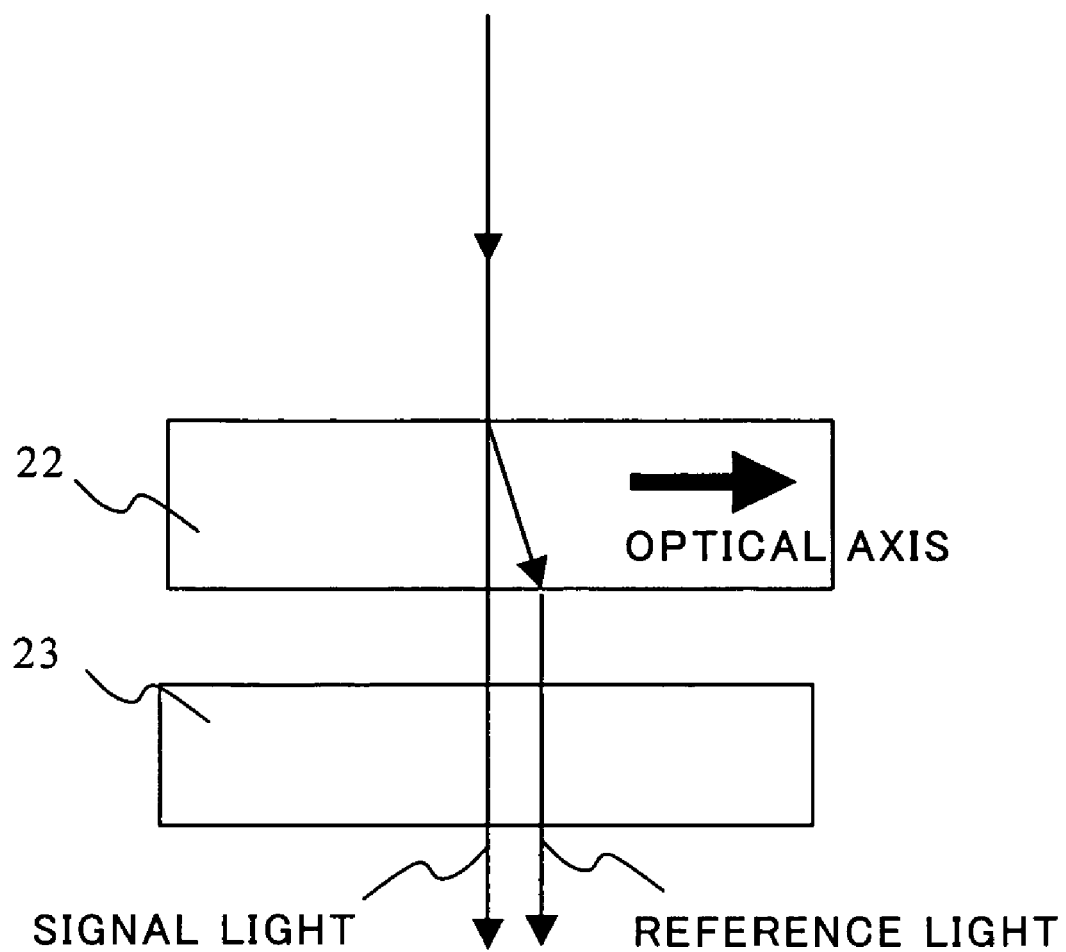
FIG. 8 is a schematic block diagram showing an exemplary shearing optical system in the maskless exposure apparatus shown in FIG. 5.

FIGS. 7 and 8 show an example of the shearing optical system of the fifth embodiment. In the configuration shown in FIG. 7, after a semi-reflecting mirror 19 (that has a semi-reflecting surface) splits the beam into two, the two beams are reflected on the mirrors 20 and 21, and superimposed on the semi-reflecting mirror 19. The lateral offset amount is adjusted by changing a position of the mirror. In the configuration shown in FIG. 8, a birefringence material 22 splits the beams into two orthogonal polarization directions with a lateral offset between the two beams using the propagation in the birefringence material 22. The birefringence material 22 uses, for example, $CaF_2$ crystal and $MgF_2$ crystal. The shearing optical system that utilizes the birefringence material 22 has an excellent stability due to the common path interferometer, and is suitable for the inventive maskless projection exposure apparatus.

The fifth embodiment that utilizes the shearing interference optical system may make each pixel in the SLM of plural reflective elements, and drive the reflective elements in one pixel in the same direction so that each reflective element has the same phase. This configuration can block the diffraction component of the scattering light by putting out the component to the outside of the NA of the projection optical system, and pass only the light corresponding to the desired pattern. The number of reflective elements per one pixel may be two or more in terms of the removal of the scattering light, and there is no upper limit. However, an excessively large number of reflective elements per one pixel increase the DMD's manufacturing cost. It is thus preferable that the number of reflective elements per one pixel is maintained between two and six.

The shearing optical system that utilizes the birefringence material easily provides a contrast when an analyzer 23 is arranged at an exit side of the shearing optical system. The analyzer 23 may use a polarization element, such as a polarization beam splitter ("PBS") and a Rochon prism. The analyzer 23 may be inserted between the shearing optical system and the substrate, and does not have to be arranged just after the shearing optical system. However, in general, the polarization element exhibits an excellent extinction ratio as the angular spread of the incident light becomes smaller. Since the projection optical system is usually a reduction optical system, the angular spread of the front side is smaller than that of the backside in the projection optical system. Therefore, it is preferable to provide the analyzer 23 in front of the projection optical system. When the two beams have the same light intensity, a high contrast is obtained by arranging the polarization direction of the analyzer 23 parallel to or orthogonal to the polarization direction of the incident light upon the shearing interference optical system. Advantageously, when the polarization direction of the analyzer 23 is orthogonal to the polarization direction of the incident light, the background scattering light can be efficiently eliminated. A rotating mechanism for the analyzer 23 is more preferable, because the contrast of the interference can be flexibly controlled and the RET corresponding to the attenuating PSM and the chrome-less mask can be realized. The shearing optical system may include plural birefringence materials. When two uniaxial crystals are arranged orthogonal to each other, a difference of the optical path length can be zero between the split two beams. See D. Malacara, Optical Shop Testing, John Wiley & Sons, 1992, chapters 3 and 4. This configuration provides high interference coherence even to a light source having a small coherence length.

Figure 9:
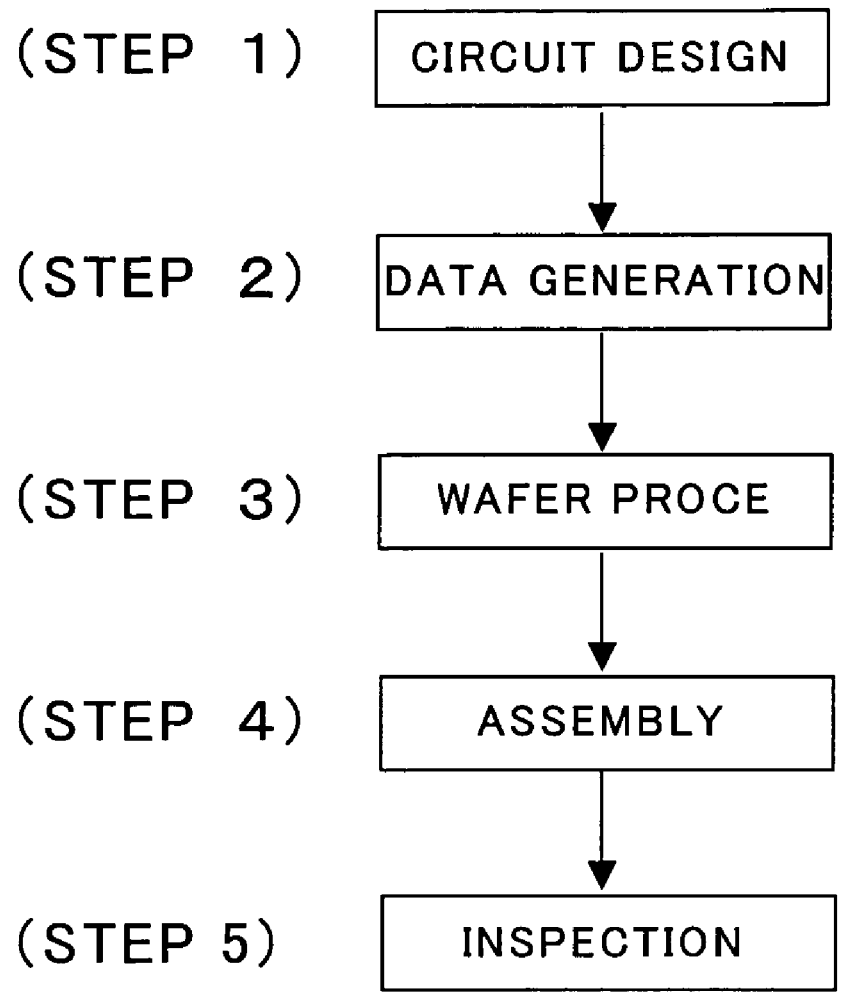
FIG. 9 is a flowchart for explaining a device manufacturing method that utilizes the inventive exposure apparatus.

A description will now be given of an embodiment of a device manufacturing method using the above projection exposure apparatus. FIG. 9 is a flowchart for explaining a fabrication of devices (i.e., semiconductor chips such as IC and LSI, liquid crystal panels, CCDs, etc.). Step 1 (circuit design) designs a device circuit. Step 2 (data generation) generates data to control the SLM in accordance with the designed circuit pattern. Step 3 (wafer process) forms a circuit pattern using the lithography. Step 4 (assembly) forms a device through separating individual circuit patterns from the wafer, wiring and packaging, followed by the inspection (step 5).

Figure 10:
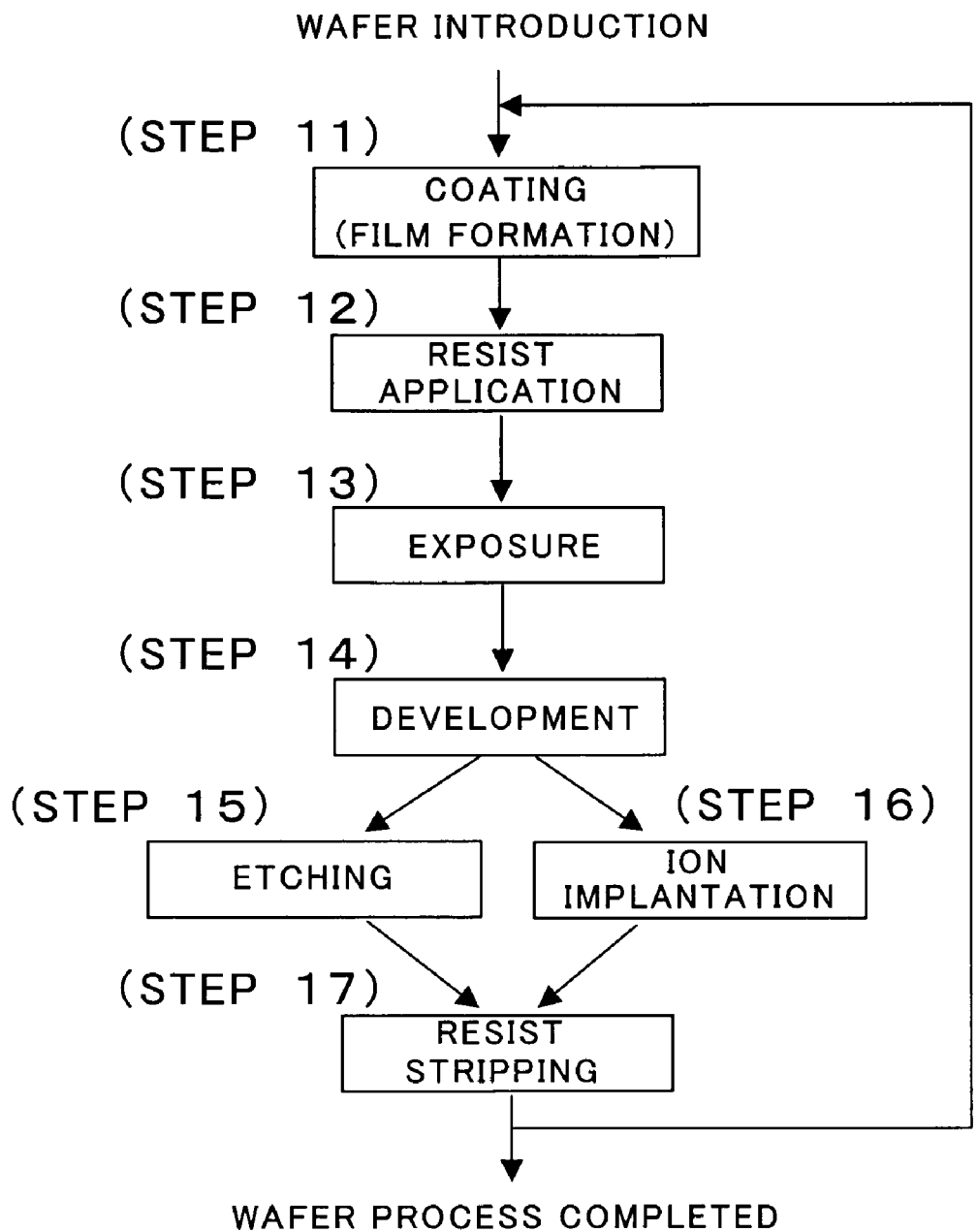
FIG. 10 is a detailed flowchart for Step 4 shown in FIG. 9.

FIG. 10 is a detailed flowchart of the wafer process. Step 11 (coating (film formation)) forms various films on the wafer through thermal oxidation, chemical vapor deposition ("CVD"), and physical vapor deposition ("PVD"). Step 12

(resist application) applies the resist and antireflection coating on the wafer. Step 13 (exposure) uses the maskless projection exposure apparatus to expose a desired pattern onto the wafer. Step 14 (development) develops the wafer. Step 15 (etching) etches the wafer, and Step 16 (ion implantation) implant ions into the wafer. Step 17 (resist stripping) removes the resist from the wafer. These steps are repeated, and multilayer circuit patterns are formed on the wafer.

Use of the device manufacturing method of this embodiment would manufacture highly integrated devices in a short time without using a costly mask.

Thus, the present invention can provide an exposure apparatus that provides a high resolving power and a high throughput with a relatively simple structure, and a device manufacturing method using the same.

Furthermore, the present invention is not limited to these preferred embodiments and various variations and modifications may be made without departing from the scope of the present invention.

This application claims a foreign priority benefit based on Japanese Patent Application No. 2004-278643, filed on Sep. 27, 2004, which is hereby incorporated by reference herein in its entirety as if fully set forth herein.

What is claimed is:

1. An exposure apparatus comprising:
  a beam splitter for splitting light from a light source into first and second beams;
  a spatial light modulator, arranged in an optical path for the first beam, for modulating a phase distribution of the first beam;
  a beam coupler for coupling the first beam with the second beam;
  a projection optical system for projecting a pattern of said spatial light modulator onto a substrate using light from said beam coupler; and
  a controller for supplying a modulation signal to said spatial light modulator,
  wherein said spatial light modulator has a one-dimensionally or two-dimensionally arranged pixels, each pixel has plural reflective elements, and the reflective elements in the same pixel displace in the same direction simultaneously.

2. An exposure apparatus according to claim 1, wherein the number of reflective elements in each pixel is between two and six.

3. An exposure apparatus according to claim 1, further comprising an attenuation filter arranged in an optical path of one of the first and second beams.

4. An exposure apparatus according to claim 1, further comprising a shutter, arranged in an optical path of the second beam, for blocking the second beam.

5. An optical modulator according to claim 1, further comprising another spatial light modulator arranged in an optical path of the second beam.

6. A device manufacturing method comprising the steps of:
  exposing an object using an exposure apparatus according to claim 1; and
  developing the object that has been exposed.

* * * * *